United States Patent
Kainuma et al.

(10) Patent No.: US 6,483,190 B1
(45) Date of Patent: Nov. 19, 2002

(54) SEMICONDUCTOR CHIP ELEMENT, SEMICONDUCTOR CHIP ELEMENT MOUNTING STRUCTURE, SEMICONDUCTOR CHIP ELEMENT MOUNTING DEVICE AND MOUNTING METHOD

(75) Inventors: Norio Kainuma, Kawasaki (JP); Shunji Baba, Kawasaki (JP); Hidehiko Kira, Kawasaki (JP); Toru Okada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 7 days.

(21) Appl. No.: 09/618,726

(22) Filed: Jul. 18, 2000

(30) Foreign Application Priority Data

Oct. 20, 1999 (JP) ............................................ 11-298804

(51) Int. Cl.$^7$ .......................... H01L 23/48; H01L 23/52; H01L 29/40
(52) U.S. Cl. ........................ 257/737; 257/738; 257/734; 257/778; 257/787; 257/785; 257/780; 257/690
(58) Field of Search ................................ 257/737, 778, 257/787, 785, 692, 738

(56) References Cited

U.S. PATENT DOCUMENTS

| | | | | |
|---|---|---|---|---|
| 5,773,882 A | * | 6/1998 | Iwasaki ...................... | 257/692 |
| 5,854,558 A | * | 12/1998 | Motooka et al. ............. | 324/754 |
| 6,163,463 A | * | 12/2000 | Marrs ......................... | 361/773 |
| 6,175,157 B1 | * | 1/2001 | Morifuji ..................... | 257/777 |

FOREIGN PATENT DOCUMENTS

| | | | |
|---|---|---|---|
| JP | 54-577 | 1/1979 | |
| JP | 62-156827 | 7/1987 | |
| JP | 63-41033 | 2/1988 | |
| JP | 63-150931 | 6/1988 | |
| JP | 401185952 | * 7/1989 | ............. 21/92 |
| JP | 02-33929 | 2/1990 | |
| JP | 03-125431 | 5/1991 | |
| JP | 07-130794 | 5/1995 | |
| JP | 07-211758 | 8/1995 | |
| JP | 09-172035 | 6/1997 | |
| JP | 10-125720 | 5/1998 | |

\* cited by examiner

*Primary Examiner*—Tom Thomas
*Assistant Examiner*—Nitin Parekh
(74) *Attorney, Agent, or Firm*—Armstrong, Westerman & Hattori, LLP

(57) ABSTRACT

An apparatus and method for improving the underfill filling of a semiconductor chip element 100 which is ultrasonically bonded to and mounted on a circuit board. A semiconductor chip element 100 includes a silicon chip 101 and a group of stud bumps 117 formed on a bottom surface 101*a* of the chip 101. Signal stud bumps 113 are made of gold while power stud bumps 114, ground stud bumps 115 and dummy stud bumps 116 are all made of a gold-palladium alloy, which are harder than the signal stud bumps 113 and thus do not deform easily during ultrasonic treatment. Therefore, in a state in which the semiconductor chip element 100 is mounted, a gap of approximately 30 $\mu$m is maintained between the bottom surface 101*a* of the chip 100 and a top surface of the circuit board 120 on which the semiconductor chip element 100 is mounted.

2 Claims, 14 Drawing Sheets

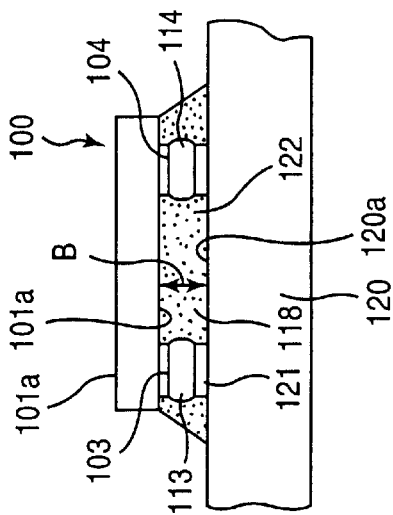
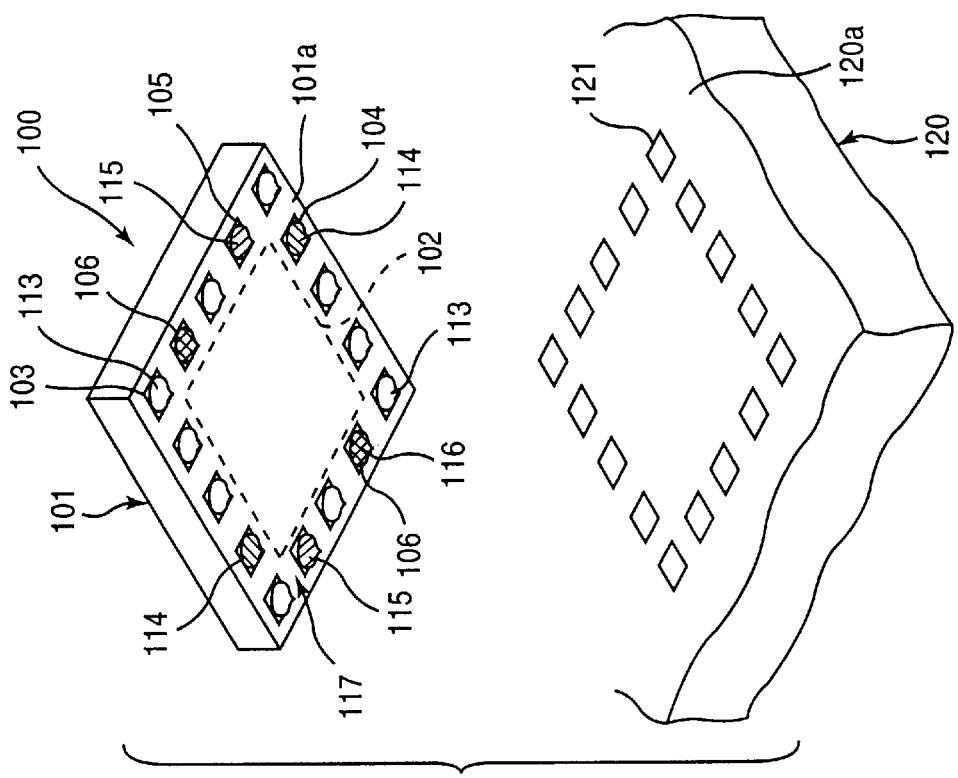

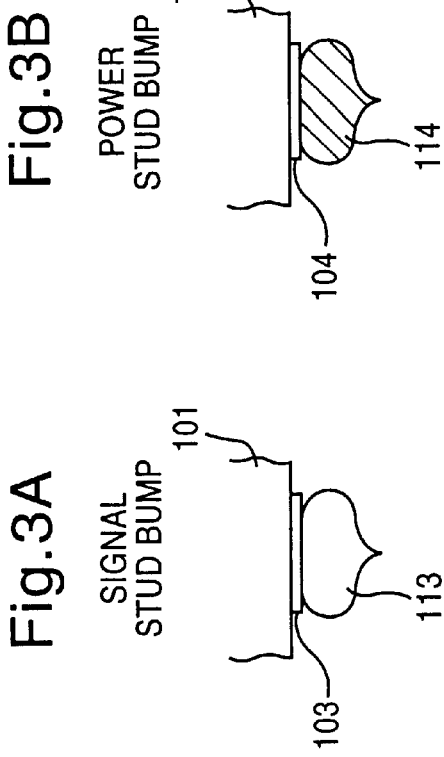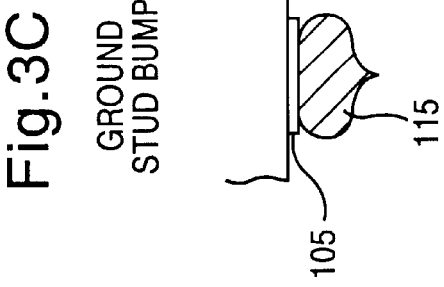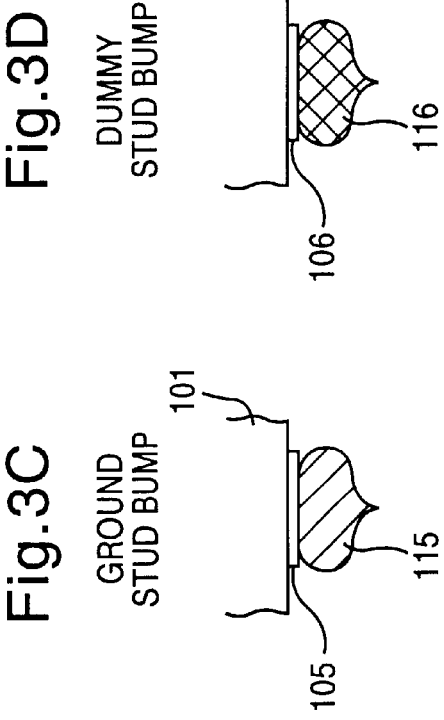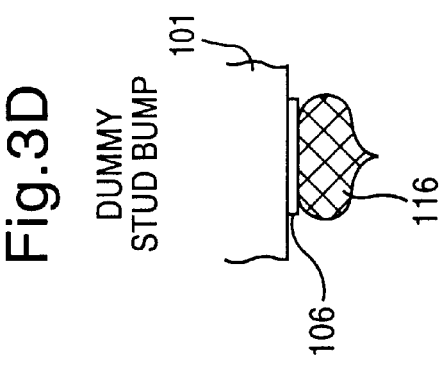

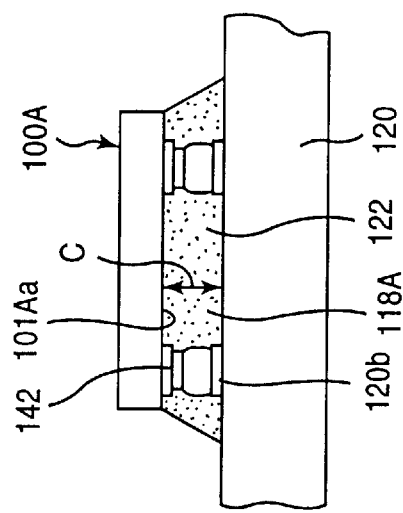
Fig.5B
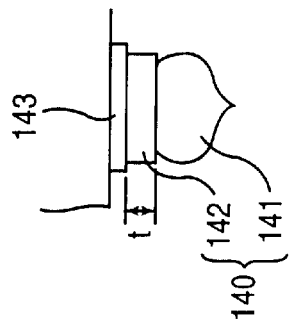
Fig.5C
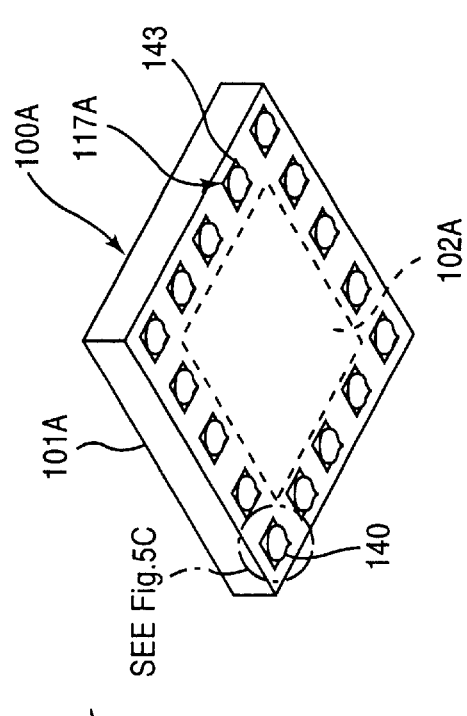
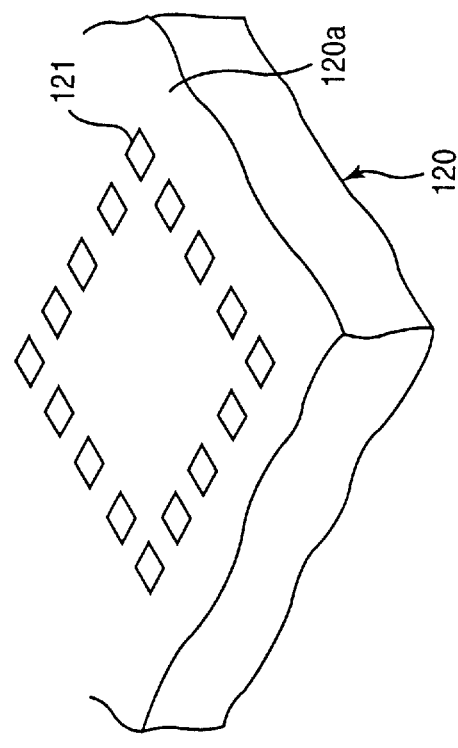
Fig.5A

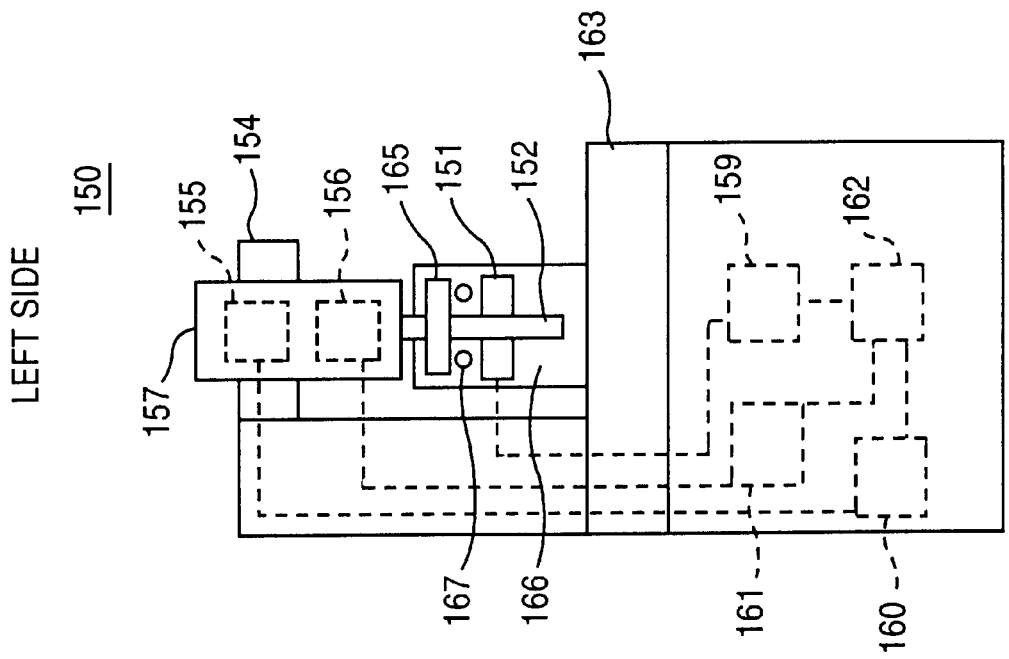
Fig.8B LEFT SIDE
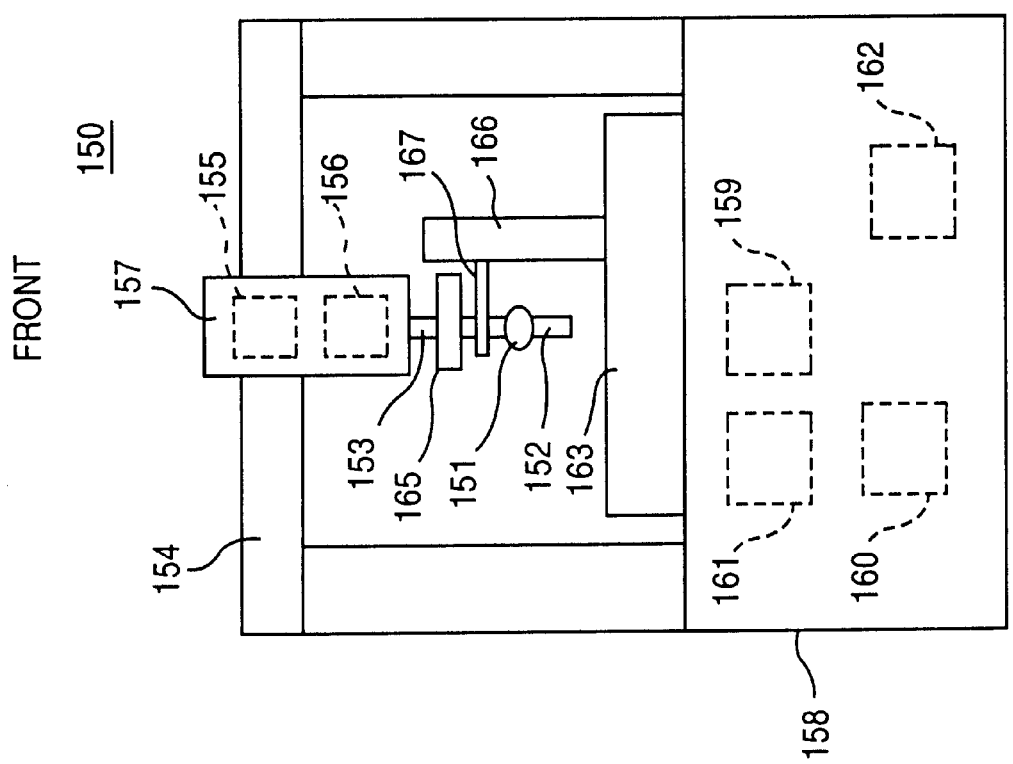
Fig.8A FRONT

PRESSURE/ULTRASOUND VIBRATION

TOOL DESCENT

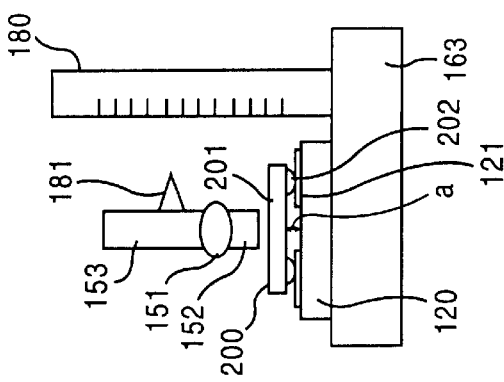
Fig. 13A ALIGNMENT
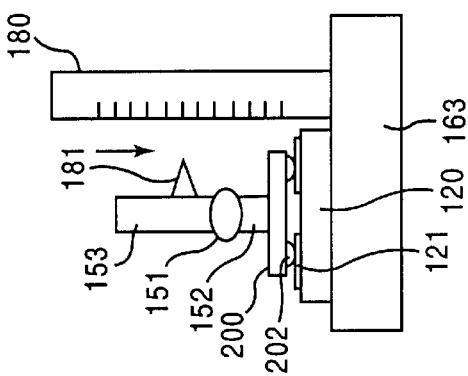
Fig. 13B PRESSURE
Fig. 13C PRESSURE ULTRASOUND VIBRATION
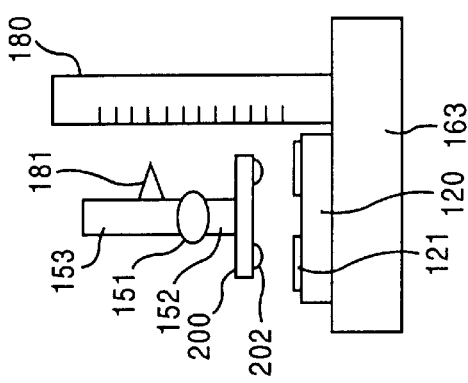
Fig. 13D FUSION COMPLETED

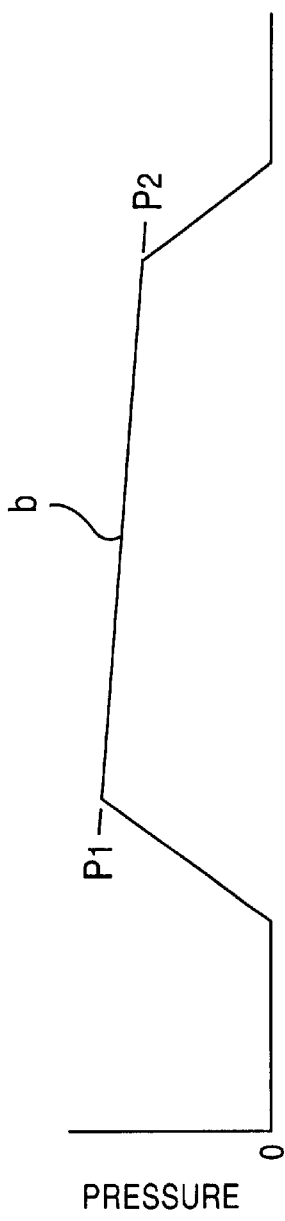
Fig.14A PRESSURE
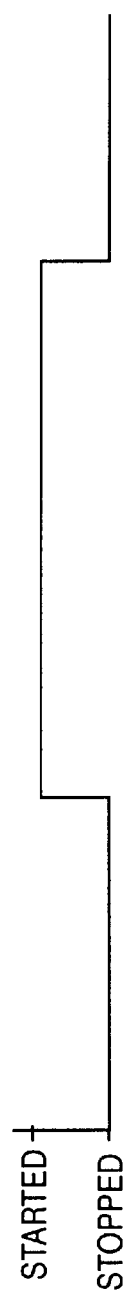
Fig.14B ULTRASOUND VIBRATOR
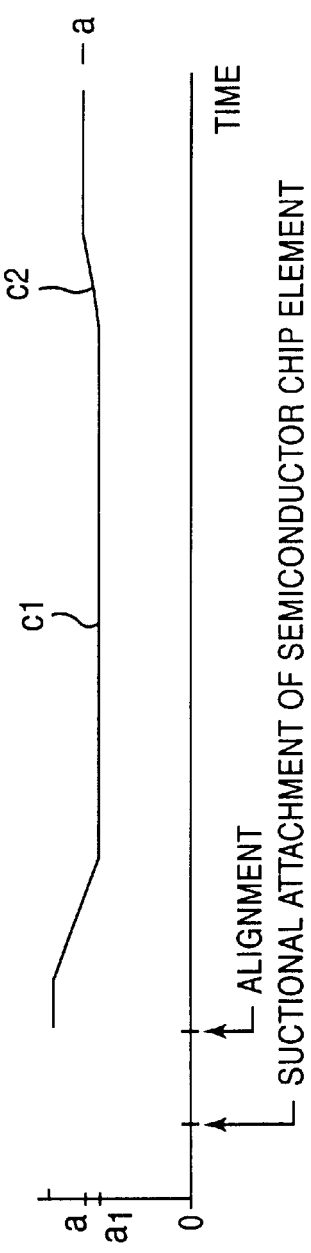
Fig.14C GAP BETWEEN CHIP AND BOARD

SEMICONDUCTOR CHIP ELEMENT, SEMICONDUCTOR CHIP ELEMENT MOUNTING STRUCTURE, SEMICONDUCTOR CHIP ELEMENT MOUNTING DEVICE AND MOUNTING METHOD

BACKGROUND OF THE INVENTION

(1) Field of the Invention

The present invention relates to a semiconductor chip element to which ultrasonic bonding is applied, a semiconductor chip element mounting structure and a semiconductor chip element mounting device and mounting method.

(2) Description of the Related Art

FIG. 1A shows a conventional semiconductor chip element 10 to be ultrasonically bonded. The semiconductor chip element 10 comprises a silicon chip 11 on a bottom surface 11a of which an integrated circuit 12 is formed and electrodes 13 made of aluminum formed at a periphery of the bottom surface 11a, on top of which are formed signal stud bumps 14, power stud bumps 15, ground stud bumps 16 (not shown in the diagram) and dummy stud bumps (not shown in the diagram). The signal stud bumps 14, power stud bumps 15, ground stud bumps 16 (not shown in the diagram) and dummy stud bumps (not shown in the diagram) are all made from 99.99% pure gold in order to lower the electrical resistance of the connecting portion connecting to a circuit board of the semiconductor chip element.

It should be noted that the stud bumps 14, 15 are formed by using a wire bonding device from the nozzle of which a gold wire is extended, and moving the wire bonding device in generally the same pattern as when performing wire bonding, with this difference: Whereas in wire bonding the wire is extended continuously from bond to bond, in forming the stud bumps 14, 15 the wire is cut at each bump, giving the bumps the substantially onion-domed shape shown in the diagrams.

As shown in FIG. 1B, the semiconductor chip element 10 is mounted in a face down position on a circuit board 30 that is itself fixedly mounted on top of a table 20, in such a way that each stud bump 14, 15 is aligned with a corresponding gold electrode 31. Under room-temperature conditions, the semiconductor chip element 10 is pressed with a tool 21 and at the same time ultrasonic vibrations are applied for a period of, for example, several seconds, with the surfaces of the stud bumps 14, 15 and the electrodes 31 (both made of gold) rubbed against each other so as to ultrasonically bond the stud bumps 14, 15 and the electrodes 31.

With the semiconductor chip element 10 in the state described above, using a device (not shown in the diagrams) an underfill 41 is injected into a gap 40 between the underside of the semiconductor chip element 10 and the circuit board 30 as shown in FIG. 1C, after which the underfill undergoes thermosetting.

As shown in FIG. 1C, the semiconductor chip element 10 is mounted on the circuit board 30 in a state in which the stud bumps 14, 15 are ultrasonically bonded to the electrodes 31 and the gap 40 is filled with the underfill 41 which is an epoxy resin. The underfill 41 strengthens the attachment of the semiconductor chip element 10 to the circuit board 30 and protects the integrated circuit 12.

It should be noted that the 99.99% pure gold only has a hardness of 75 Hv on the Vickers hardness scale, that is, is soft. As a result, it sometimes happens that the stud bumps 14, 15 suffer substantial deformation when ultrasonically bonded to the electrodes, in which case a height A of the gap 40 described above narrows sharply, to approximately 10 μm. When the gap 40 narrows, not enough of the underfill 41 enters the gap 40 to fill the gap 40 completely and so an unfilled space indicated in FIG. 1C by reference numeral 42 is left.

It will be appreciated that the presence of the unfilled space 42 reduces the effectiveness of the underfill 41 and hence reduces the strength of the attachment or mounting of the semiconductor chip element 10 on the circuit board 30, and additionally, fails to fully protect the integrated circuit 12.

It is possible to maintain the gap 40 at a height A greater than 10 μm by raising a height h of the stud bumps 14, 15. However, since the stud bumps 14, 15 are formed in much the same way that wire bonding is performed, if the height h is increased then a diameter d of the stud bumps 14, 15 also increases, yet at the same time the pitch of the stud bump alignment imposes limitations on the diameter of the stud bumps 14, 15. As a result, there is a practical limit to the extent to which the height h of the stud bumps 14, 15 can be increased.

SUMMARY OF THE INVENTION

Accordingly, the present invention has as its object to provide a semiconductor chip element, a semiconductor chip element mounting device and mounting method in which, under the above-described conditions, the above-described disadvantage is eliminated.

The above-described object of the present invention is achieved by the invention according to one embodiment, comprising a semiconductor chip element including a chip as well as signal stud bumps and non-signal stud bumps dispersedly aligned on a bump formation surface of the chip and the semiconductor chip element being adapted to be bonded and mounted by using ultrasonic vibrations, the semiconductor chip element characterized by having the non-signal stud bumps made of a material having a hardness greater than a hardness of a material from which the signal stud bumps are made.

According to the invention described above, the degree to which the non-signal stud bumps deform when ultrasonically bonded is reduced, and accordingly, a relatively wide gap as compared to the conventional art can be maintained between a bottom surface of the semiconductor chip element and a circuit board when the former is mounted on the latter, thus improving the filling of the gap with an underfill.

Additionally, the above-described object of the present invention is also achieved by the invention, comprising the semiconductor chip element described above, characterized in that the signal stud bumps are made of gold (Au) and the non-signal stud bumps are made of a gold-palladium alloy.

According to the invention described above, the non-signal stud bumps made of gold-palladium alloy are harder than the signal stud bumps made of pure gold. The signal stud bumps made of pure gold have a reduced electrical resistance.

Additionally, the above-described object of the present invention is also achieved by the invention, comprising a semiconductor chip element including a chip as well as signal stud bumps and non-signal stud bumps dispersedly aligned on a bump formation surface of the chip and the semiconductor chip element being adapted to be bonded and mounted by using ultrasonic vibrations, characterized by having plated bumps on the bump formation surface of the chip and the stud bumps formed on top of the plated bumps to form combination stacked bumps.

According to the invention described above, the plated bumps do not deform as easily as the stud bumps during ultrasonic treatment, so a relatively wide gap as compared to the conventional art can be maintained between a bottom surface of the semiconductor chip element and a circuit board when the former is mounted on the latter, thus improving the filling of the gap with an underfill.

Additionally, the above-described object of the present invention is also achieved by the invention, comprising a semiconductor chip described above, characterized in that the stud bumps are made of gold and the plated bumps are made of gold.

According to the invention described above, the gold plated bumps are of the same material as the gold stud bumps, so the quality of the connection of the stud bumps to the plated bumps is improved. The stud bumps may be dispensed with plated bumps, where the plated bumps are previously made of a gold-palladium alloy. Combination stacked bumps may also be used, where the plated bump portion is made of a gold-palladium alloy and the stud bump portion is made of gold.

Additionally, the above-described object of the present invention is also achieved by the invention, comprising a semiconductor chip element mounting structure, in which the semiconductor chip element is ultrasonically bonded and mounted to a member to be mounted.

According to the invention described above, a relatively wide gap as compared to the conventional art can be maintained between a bottom surface of the semiconductor chip element and a circuit board when the former is mounted on the latter, thus improving the filling of the gap with an underfill.

Additionally, the above-described object of the present invention is also achieved by the invention, comprising a semiconductor chip element mounting device in which a semiconductor chip element comprising a chip and stud bumps dispersedly aligned on a bump formation surface of the chip is pressed by a bonding tool and to which ultrasonic vibrations are applied to bond and mount the semiconductor chip element, the semiconductor chip element mounting device characterized by having restricting means for restricting a height position of the descending bonding tool.

According to the invention described above, the height position of maximum descent of the bonding tool is determined by the restricting means, so a relatively wide gap as compared to the conventional art can be maintained between a bottom surface of the semiconductor chip element and a circuit board when the former is mounted on the latter, thus improving the filling of the gap with an underfill.

Additionally, the above-described object of the present invention is also achieved by the invention, comprising a semiconductor chip element mounting method in which a semiconductor chip element comprising a chip and stud bumps dispersedly aligned on a bump formation surface of the chip is pressed by a bonding tool and to which ultrasonic vibrations are applied to bond and mount the semiconductor chip element, the semiconductor chip element mounting method characterized by having a step of restricting a height position of the descending bonding tool.

According to the invention described above, the height position of maximum descent of the descending bonding tool is pre-determined, so a relatively wide gap as compared to the conventional art can be maintained between a bottom surface of the semiconductor chip element and a circuit board when the former is mounted on the latter, thus improving the filling of the gap with an underfill.

Additionally, the above-described object of the present invention is also achieved by the invention, comprising a semiconductor chip element mounting device in which a semiconductor chip element comprising a chip and stud bumps dispersedly aligned on a bump formation surface of the chip is pressed by a bonding tool and to which ultrasonic vibrations are applied to bond and mount the semiconductor chip element, the semiconductor chip element mounting device characterized by having:

bonding tool height position detecting means for detecting a height position of the bonding tool; and adjusting means for adjusting the height position of the bonding tool so as to maintain the height position detected by the bonding tool height position detecting means at a predetermined height.

According to the invention described above, by maintaining the bonding tool at a predetermined height position a relatively wide gap as compared to the conventional art can be maintained between a bottom surface of the semiconductor chip element and a circuit board when the former is mounted on the latter, thus improving the filling of the gap with an underfill.

Additionally, the above-described object of the present invention is also achieved by the invention comprising a semiconductor chip element mounting method in which a semiconductor chip element comprising a chip and stud bumps dispersedly aligned on a bump formation surface of the chip is pressed by a bonding tool and to which ultrasonic vibrations are applied to bond and mount the semiconductor chip element, the semiconductor chip element mounting method characterized in that a height position of the bonding tool is detected and the height position of the bonding tool is maintained at a predetermined height so as to mount the semiconductor chip element at the predetermined height.

According to the invention described above, by maintaining the bonding tool at a predetermined height position a relatively wide gap as compared to the conventional art can be maintained between a bottom surface of the semiconductor chip element and a circuit board when the former is mounted on the latter, thus improving the filling of the gap with an underfill.

BRIEF DESCRIPTION OF THE DRAWINGS

FIGS. 2A and 2B are diagrams showing a semiconductor chip element according to a first embodiment of the present invention, together with a view of the semiconductor chip element in a mounted state.

FIGS. 3A–3D are diagrams showing an enlarged view of each stud bump shown in FIG. 2.

FIGS. 5A–5C are diagrams showing a semiconductor chip element according to a second embodiment of the present invention, together in a mounted state.

FIGS. 8A and 8B are diagrams showing a semiconductor chip element mounting device according to a fifth embodiment of the present invention.

FIGS. 13A, 13B, 13C and 13D are diagrams showing a mounting operation of the mounting device of FIG. 11.

FIGS. 14A, 14B and 14C are time charts of mounting operations.

DETAILED DESCRIPTION OF THE INVENTION

Figure 1A:
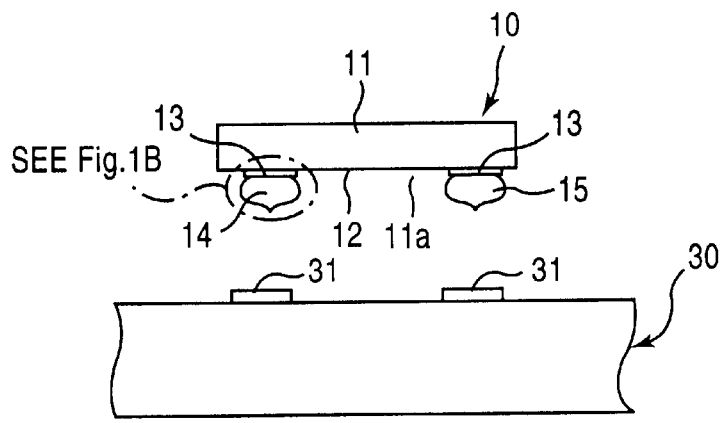
FIGS. 1A–1D are diagrams showing an example of the conventional art.
Figure 1B:
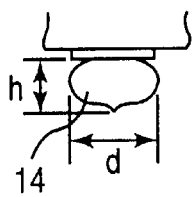
Figure 1C:
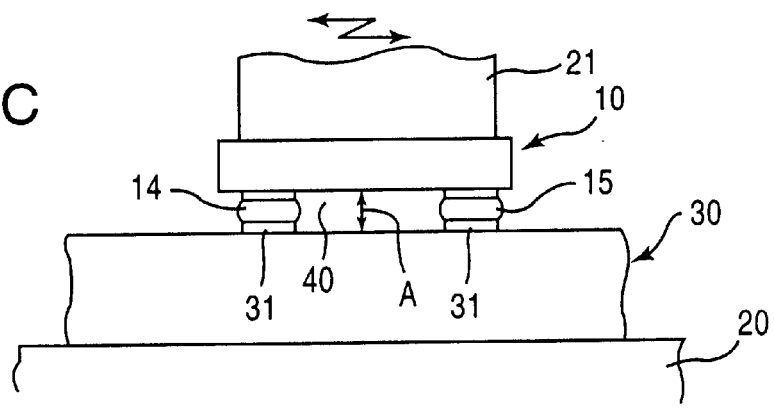
Figure 1D:
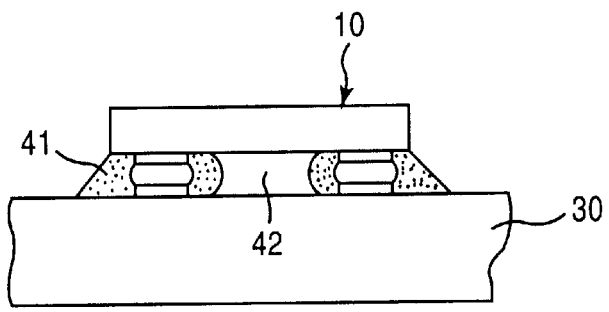
Figure 4B:
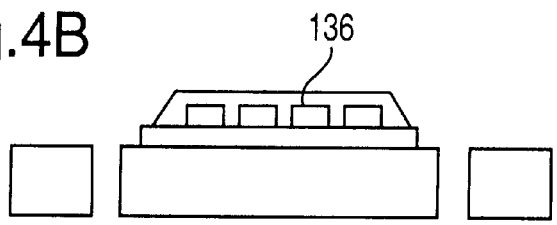
FIG. 4 is a diagram showing a variation of a mounting of the semiconductor chip element.
Figure 4A:
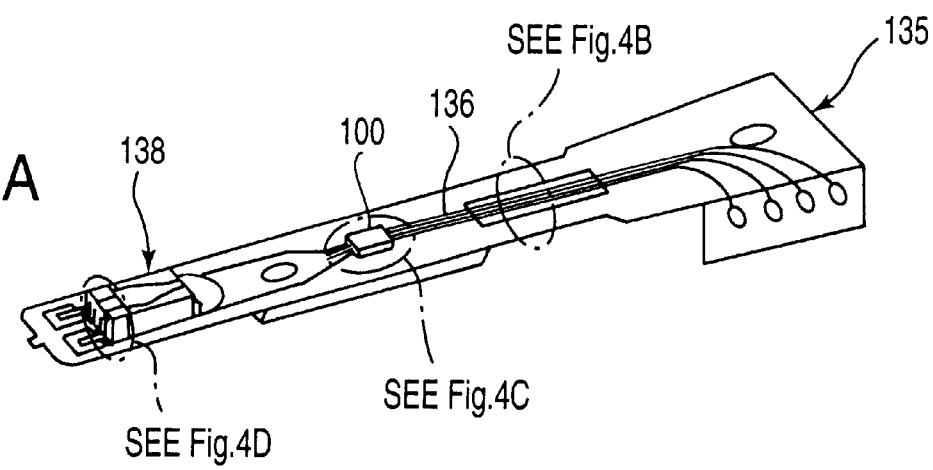
Figure 4D:
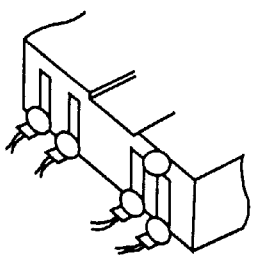
Figure 4C:
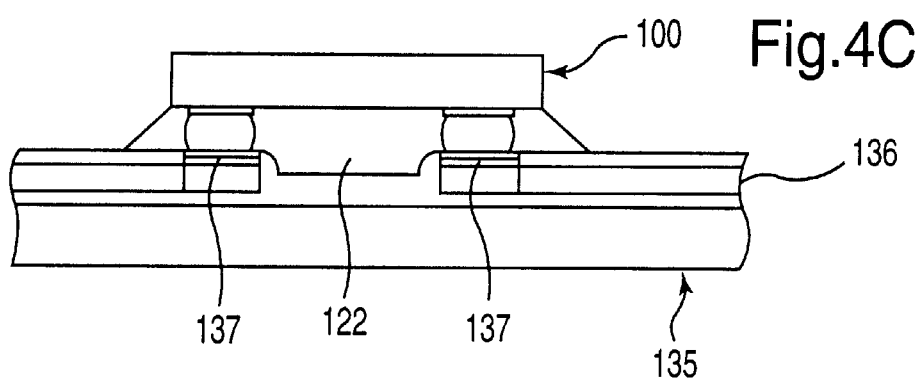

FIG. 2A is a diagram showing a semiconductor chip element 100 according to a first embodiment of the present invention, together with a view (FIG. 2B) of the semiconductor chip element 100 in a mounted state. The semiconductor chip element 100 has a structure consisting of a silicon chip 101 on a bottom surface 101a of which (that is, on a surface on which bumps are to be formed) a group of stud bumps 117 are formed. The group of stud bumps 117 comprises signal stud bumps 113, power stud bumps 114, ground stud bumps 115 and dummy stud bumps 116. The power stud bumps 114, ground stud bumps 115 and dummy stud bumps 116 are non-signal stud bumps.

The signal stud bumps 113 comprise the majority of stud bumps 117, among which the power stud bumps 114, the ground stud bumps 115, and dummy stud bumps 116 are dispersed substantially uniformly, with each stud bump 113, 114, 115, 116 aligned along a periphery of the chip 101.

It should be noted that in the drawings the signal stud bumps 113 are represented as blank, the power stud bumps 114 are represented by hatching sloping downward to the left, the ground stud bumps 115 are represented by hatching sloping downward to the right and the dummy stud bumps 116 are represented by cross hatching. The dummy stud bumps 116 are disposed at positions where there are neither signal stud bumps 113 nor power stud bumps 114 nor ground stud bumps 115, so that there are no open positions and the semiconductor chip is mounted stably.

For convenience of explanation, a comparison is given of the properties of 99.99% pure gold and the gold-palladium alloy consisting of 99–99.5% gold and 1–0.5% palladium.

The gold has a hardness of 75 Hv on the Vickers hardness scale and the gold-palladium alloy has a hardness of 95 Hv on the Vickers hardness scale.

An integrated circuit 102 is formed on the bottom surface 101a of the chip 101, around a periphery of which are aligned signal electrodes 103, power electrodes 104, ground electrodes 105 and dummy electrodes 106, all made of aluminum. The majority of electrodes are signal electrodes 103, dispersed among the power electrodes 104, the ground electrodes 105 and the dummy electrodes 106.

As shown in FIG. 3A, a signal stud bump 113 is formed on top of the signal electrode 103. As shown in FIG. 3B, the power stud bump 114 is formed on top of the power electrode 104. As shown in FIG. 3C the ground stud bump 115 is formed on top of the ground electrode 105. As shown in FIG. 3D, the dummy stud bump 116 is formed on top of the dummy electrode 106. Each of the stud bumps 113, 114, 115 and 116 are formed by using a wire bonding device from the nozzle of which a gold wire is extended, and moving the wire bonding device in generally the same pattern as when performing wire bonding, and have the same size.

The signal stud bump 113 through which signals flow is formed using wire that is 99.99% pure gold in order to lower the electrical resistance of the connection thereby formed with a circuit board 120.

The power stud bumps 114 connected to the power source and the ground stud bumps 115 that are grounded, not to mention the dummy electrodes 106, are not required to have electrical resistances as low as that required of the signal stud bumps 113. Accordingly, the power stud bumps 114, the ground stud bumps 115 and the dummy electrodes 106 are formed of a gold-palladium alloy wire.

As a result, the stud bumps 114, 115 and 116 that are harder than the soft stud bumps 113 that comprise the majority of the stud bump group 117 are dispersed substantially uniformly among the soft stud bumps 113.

As shown in FIG. 2B, the semiconductor chip element 100 is mounted face down on top of a circuit board 120 that is itself fixedly mounted on top of a table, in such a way that each of the stud bumps 113, 114, 115 and 116 is aligned with corresponding gold electrodes 121. Under room-temperature conditions, the semiconductor chip element 100 is pressed with a tool and at the same time ultrasonic vibrations are applied for a period of, for example, several seconds, the stud bumps 113, 114, 115 and 116 somewhat flattened, and the surfaces of the stud bumps 113, 114, 115 and 116 as well as the electrodes 121, all of which are made of gold, are rubbed against each other so as to ultrasonically bond the stud bumps 113, 114, 115 and 116 and the electrodes 121.

The presence of the hard stud bumps 114, 115, 116 dispersed among the soft stud bumps 113 results in less flattening of the stud bumps than has hitherto been the case with the conventional semiconductor chip element 10 in which all the stud bumps are soft. As a result, a height dimension B of approximately 30 μm is maintained between the bottom surface 101a of the chip 101 and a top surface 120a of the circuit board 120, or approximately three times the conventional height dimension. Additionally, because the hard stud bumps 114, 115 and 116 are not concentrated in one location but dispersed, the height dimension B of the gap 118 is substantially uniform across the entire width and breadth of the gap 118. That is, a wide and uniform gap 118 can be obtained without using an additional member and solely by adjusting the composition of the stud bumps.

At this point, a device (not shown in the diagram) is used to inject an epoxy resin underfill 122 into the interior of the gap 118 on the underside of the semiconductor chip element 100, after which the underfill 122 undergoes thermosetting (refer to FIG. 2B). The underfill 122 strengthens the attachment of the semiconductor chip element 100 to the circuit board 120 and protects the integrated circuit 102.

It should be noted that, as described above, the height B of the gap 118 is approximately 30 μm, or approximately three times the conventional gap height, and furthermore the height B is substantially uniform across the entire width and breadth of the gap thereof. Accordingly, the underfill 122 fills the entire gap 118 well, so that no unfilled space remains. As a result, the attachment of the semiconductor chip element 100 to the circuit board 120 is a highly reliable one.

It should be noted that the wider-than-conventional height of the gap provides an additional advantage in case no underfill is used at all. That is, the broader the gap 118 the greater the distance between the stud bumps 113, 114, 115 and 116 on the one hand and the circuit board 120 on the other, which in turn means an increased ability to absorb thermal stress arising between the semiconductor chip element 100 and the circuit board 120. A high capacity to absorb thermal stress in turn means a stronger attachment between the semiconductor chip element 100 and the circuit board 130.

FIG. 4 is a diagram showing a variation of a mounting of the semiconductor chip element 100. As shown in FIG. 4, the semiconductor chip element 100 can be mounted on a stainless steel plate suspension 135 instead of the circuit board 120. The suspension 135 is assembled in the hard disk drive, a wiring pattern 136 and an electrode 137 are formed and a tip of the head slider 138 is fixedly mounted. That is, the semiconductor chip element 100 is also securely mounted on the above-described suspension 135. In this case, the semiconductor chip element 100 is specifically a head IC for controlling the head.

A description will now be given of a semiconductor chip element according to a second embodiment of the present invention, with reference to the accompanying drawings.

FIG. 5A is a diagram showing a semiconductor chip element 100A according to a second embodiment of the present invention, together in a mounted state (FIG. 5B). The semiconductor chip element 100A comprises a silicon chip 101A and a group of stud bumps 117A formed on a bottom surface 101Aa of the chip. The group of stud bumps 117A comprises a multiplicity of combination stacked bumps 140, with each combination stacked bump 140 being a combination of a gold stud bump 141 and a gold plated bump 142.

An integrated circuit 102A is formed on a bottom surface 101Aa of the chip 101A, with electrodes 143 made of aluminum aligned around a periphery thereof.

As shown enlarged in FIG. 5A, the gold plated bump 142 is formed on top of the electrode 143, with the gold stud bump 141 formed on top of the gold plated bump 142.

The gold plated bump 142 has a thickness t of approximately 30 µm, and is formed by a process of electrolytic plating performed for a predetermined period of time. The gold plated bump 142 is harder than and thus does not flatten as easily as the gold stud bump 141, which is formed by using a wire bonding device from the nozzle of which a gold wire is extended, and moving the wire bonding device in generally the same pattern as when performing wire bonding. The stud bump 141 and the plate bump 142 are both made of gold, so the bond between them is strong and the electrical resistance between them is low.

Figure 6A:
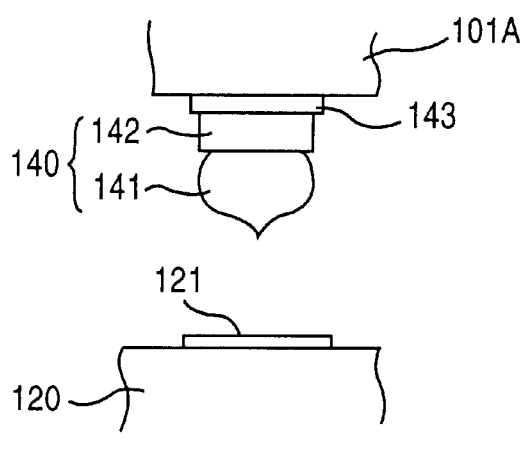
FIG. 6 is a diagram showing a bonding of a stacked bump with an electrode.
Figure 6B:
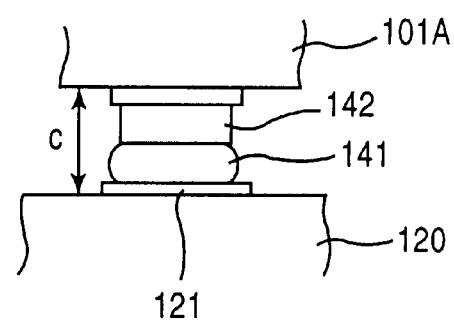

The semiconductor chip element 100A, as with that shown in FIG. 6, is mounted face down on the circuit board 120 which is itself fixedly mounted on a table, so that each of the combination stacked bumps 140 is aligned with and mounted to a corresponding gold electrode 121. Under room-temperature conditions, the semiconductor chip element 100A is pressed and at the same time ultrasonic vibrations are applied for a period of, for example, several seconds, with the stud bumps 141 and plate bumps 142 somewhat flattened, the surfaces of the stud bumps 141 and the electrodes 121 (both made of gold) being rubbed against each other so as to ultrasonically bond the stud bumps 141 and the electrodes 121. The plated bumps 142 flatten less than the stud bumps 141.

Thereafter, a device (not shown in the diagram) is used to fill the interior of a gap 118A on the underside of the semiconductor chip element 100A with an epoxy resin underfill 122, after which the underfill undergoes thermosetting (see FIG. 5B). The underfill 122 strengthens the attachment of the semiconductor chip element 100A to the circuit board 120 and protects the integrated circuit 102A.

The presence of the hard gold plated bumps 142 ensures that retention of a height dimension C of approximately 30 µm is maintained substantially uniformly across an entirety of a gap 118A of the chip 101A and a top surface 120a of the circuit board 120, or approximately three times the conventional height dimension. Accordingly, the underfill 122 enters and fills the entirety of the gap 118A, leaving no unfilled space. As a result, the semiconductor chip element 100A is mounted securely on the circuit board 120.

Additionally, the semiconductor chip element 100A can be mounted on top of a suspension 135 as shown in FIG. 4, in place of the above-described circuit board 120. That is, the semiconductor chip element 100A is also securely mounted on the above-described suspension 135. In this case, the semiconductor chip element 100A is specifically a head IC for controlling the head.

Figure 7A:
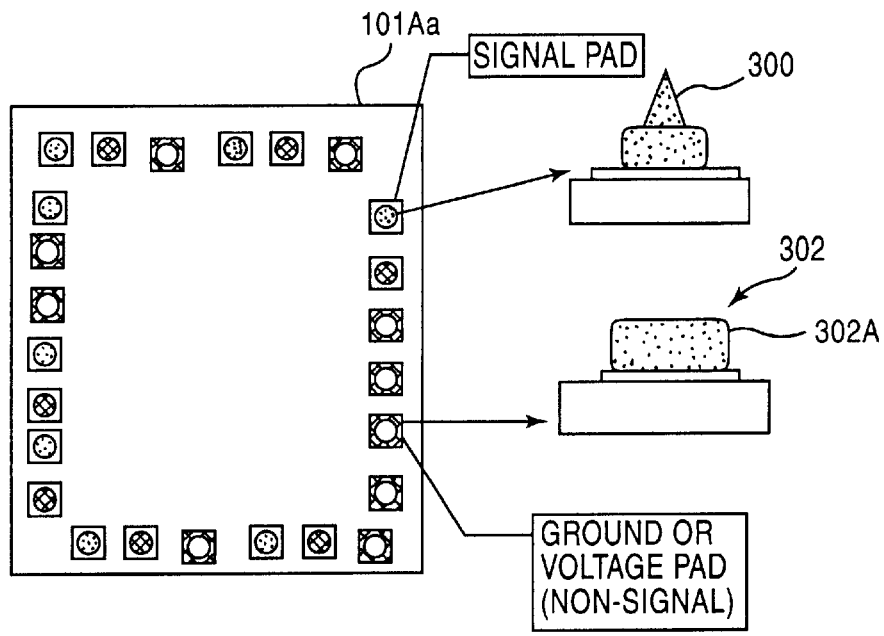
FIGS. 7A and 7B are diagrams showing a semiconductor chip element according to third and fourth embodiments, respectively of the present invention.
Figure 7B:
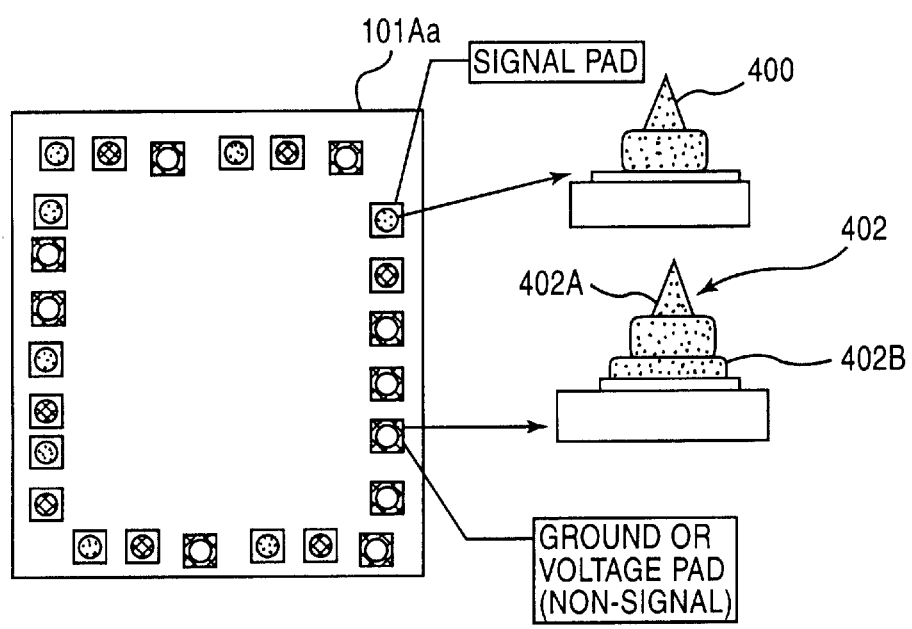

FIGS. 7A and 7B show a semiconductor chip element according to third and fourth embodiments, respectively, of the present invention.

As shown in FIG. 7A, both signal stud bumps 300 and non-signal plated bumps 302 may be dispensed on the bottom surface 101Aa of chip 101A in a manner similar to that of the second embodiment. In this case, however, the non-signal plated bumps 302 consist only of a plated portion 302A. Preferably, in this embodiment, the signal stud bumps 300 are made of gold and the non-signal plated bumps 302 are made of a gold-palladium alloy.

As shown in FIG. 7B, both signal stud bumps 400 and non-signal combination stacked bumps 402 may be dispensed on the bottom surface 101Aa of chip 101A in a manner similar to that of the second embodiment. In this case, however, the non-signal combination stacked bumps 402 are preferably formed of gold for the stud bump portion 402A and a gold-palladium alloy for the plated bump portion 402B.

A description will now be given of a semiconductor chip element mounting device according to a fifth embodiment of the present invention, with reference to the accompanying drawings.

FIGS. 8A and 8B are diagrams showing a semiconductor chip element mounting device 150 according to a fifth embodiment of the present invention. In general, the semiconductor chip element mounting device 150 comprises an ultrasonic vibrator 151 provided on a bonding tool 152 supported at a bottom tip of a rod 153, the rod 153 in turn supported by a bridge beam 154, supported by a bonding head 157 inside of which are provided a vacuum valve 155, a pressurizer (see FIG. 11) and a pressure detector (load cell) 156, and a housing 158, inside of which are provided an ultrasonic oscillator 159 that drives the ultrasonic vibrator, a vacuum valve controller 160 that controls the vacuum valve 155, a pressure controller 161 that controls the pressure detector 156 and an overall controller 162 that controls the entire unit, with a stage 163 provided atop the housing 158.

The semiconductor chip element mounting device 150 further comprises a moving-side stopper 165 provided on the rod 153, a guide 166 protruding from atop the stage 163, and a stationary stopper 167 provided on the guide 166.

The semiconductor chip element mounting device 150 mounts the semiconductor chip element 200 shown in FIG. 9 on the circuit board 120. The semiconductor chip element 200 has gold stud bumps 202 aligned around a periphery of a bottom surface of the chip 201.

Figure 9B:
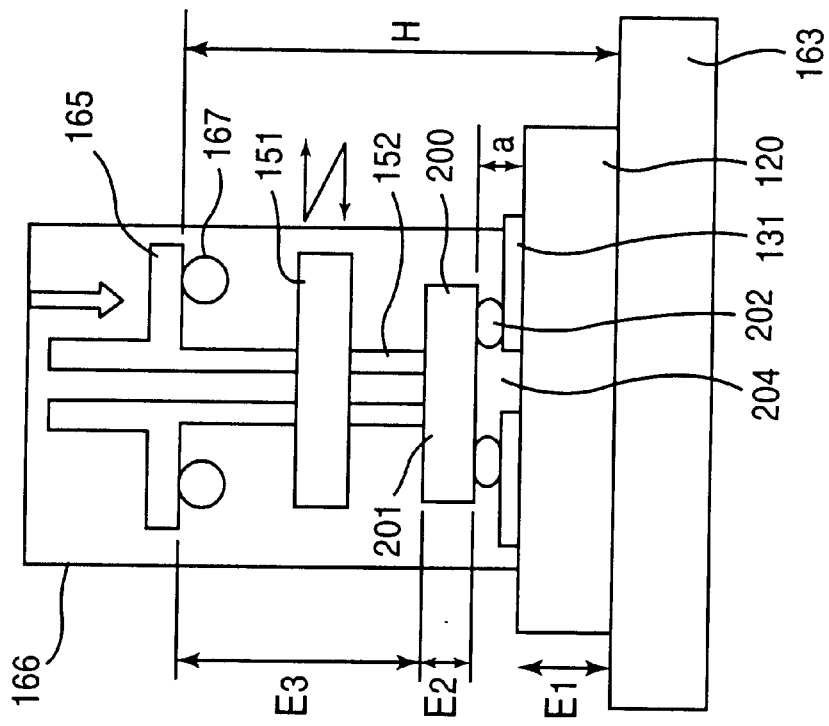
FIGS. 9A and 9B are diagrams showing a mounting operation of the mounting device of FIGS. 8A and 8B.
Figure 9A:
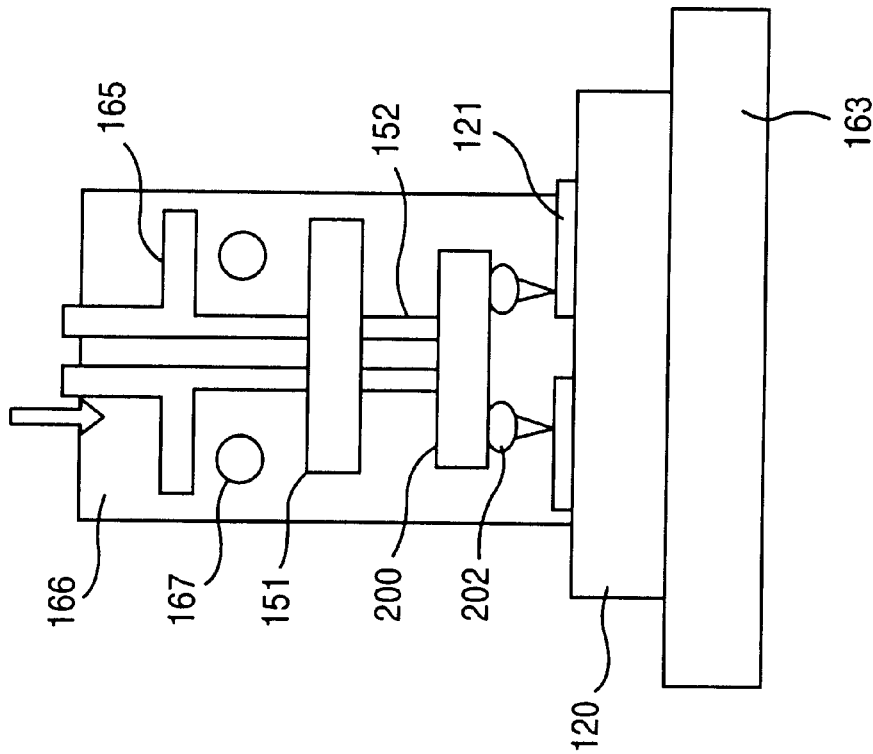
Figure 10A:
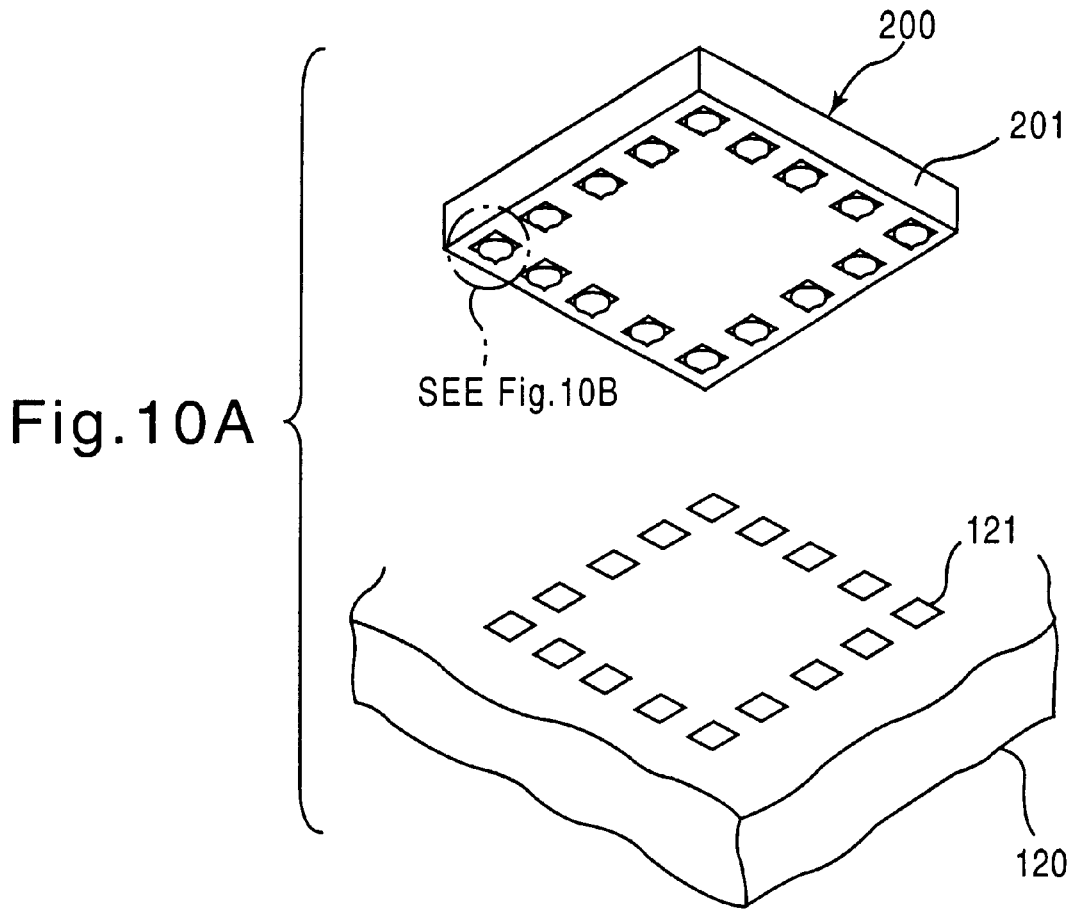
FIG. 10 is a diagram showing a mounted semiconductor chip element.
Figure 10B:
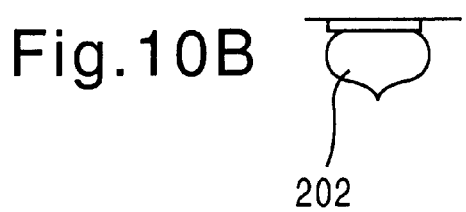
Figure 10C:
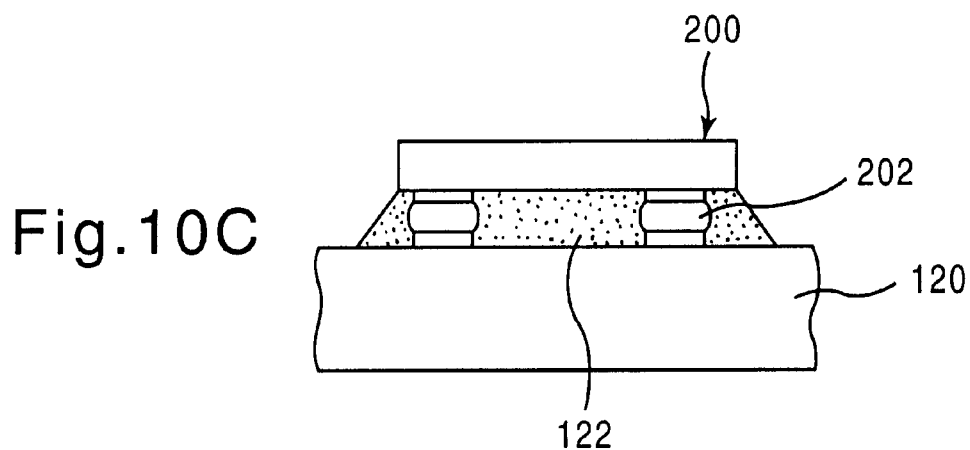

FIGS. 9A and 9B are diagrams showing a mounting operation of the semiconductor chip element mounting device of FIGS. 8A and 8B. FIG. 9A shows a state in which the circuit board 120 fixedly mounted atop the stage 163, with the semiconductor chip element 200 suctionally attached to the bonding tool 152 and lowered. FIG. 9B shows a state in which the bonding tool 152 applies pressure to the semiconductor chip element 200, to which ultrasonic vibration is further applied. The stud bumps 202 are somewhat flattened, the surfaces of the stud bumps 202 and the electrodes 121 (which are both made of gold) are rubbed together and the stud bumps 202 are ultrasonically bonded to the electrodes 121.

It should be noted that a height H of the stationary stopper with respect to the stage 163 is fixed at $H$=thickness $E1$ of the circuit board 130+thickness $E2$ of the chip 201 of the semiconductor chip element 200+distance $E3$ from the tip of the bonding tool 152 to the moving-side stopper 165+approximately 30 μm.

Accordingly, the point of maximum descent of the bonding tool 152 is, as shown in FIG. 8B, the point at which the moving-side stopper 165 contacts the stationary stopper 167, for the bonding tool 152 descends no further.

Accordingly, as shown in FIGS. 9A and 9B, the semiconductor chip element 200 is mounted on the circuit board 120 in a state in which a gap 204 between the chip 201 and the circuit board 120 is maintained at approximately 30 μm.

Accordingly, in the event that underfill is injected as a final step so as to fill the entire gap 204, then no unfilled space remains. As a result, the semiconductor chip element 200 is securely mounted on the circuit board 120.

It should be noted that, even if no underfill is injected, the great height of the stud bumps means that thermal stress arising in the space between the semiconductor chip element 200 and the circuit board 100 is absorbed effectively, so the semiconductor chip element 200 is securely mounted on the circuit board 120.

Additionally, the suspension 135 fixedly mounted on the stage 163 as shown in FIG. 4 may be used in place of the above-described circuit board 120. By adjusting the height H of the stationary stopper 167 with respect to the stage 163 to the height H of the suspension 135, the semiconductor chip element 200 is mounted securely on the suspension 135 while maintaining the above-described gap. Specifically, the semiconductor chip element 200 in this case is a head IC that controls the head.

A description will now be given of a semiconductor chip element mounting device according to a sixth embodiment of the present invention, with reference to the accompanying drawings.

Figure 11:
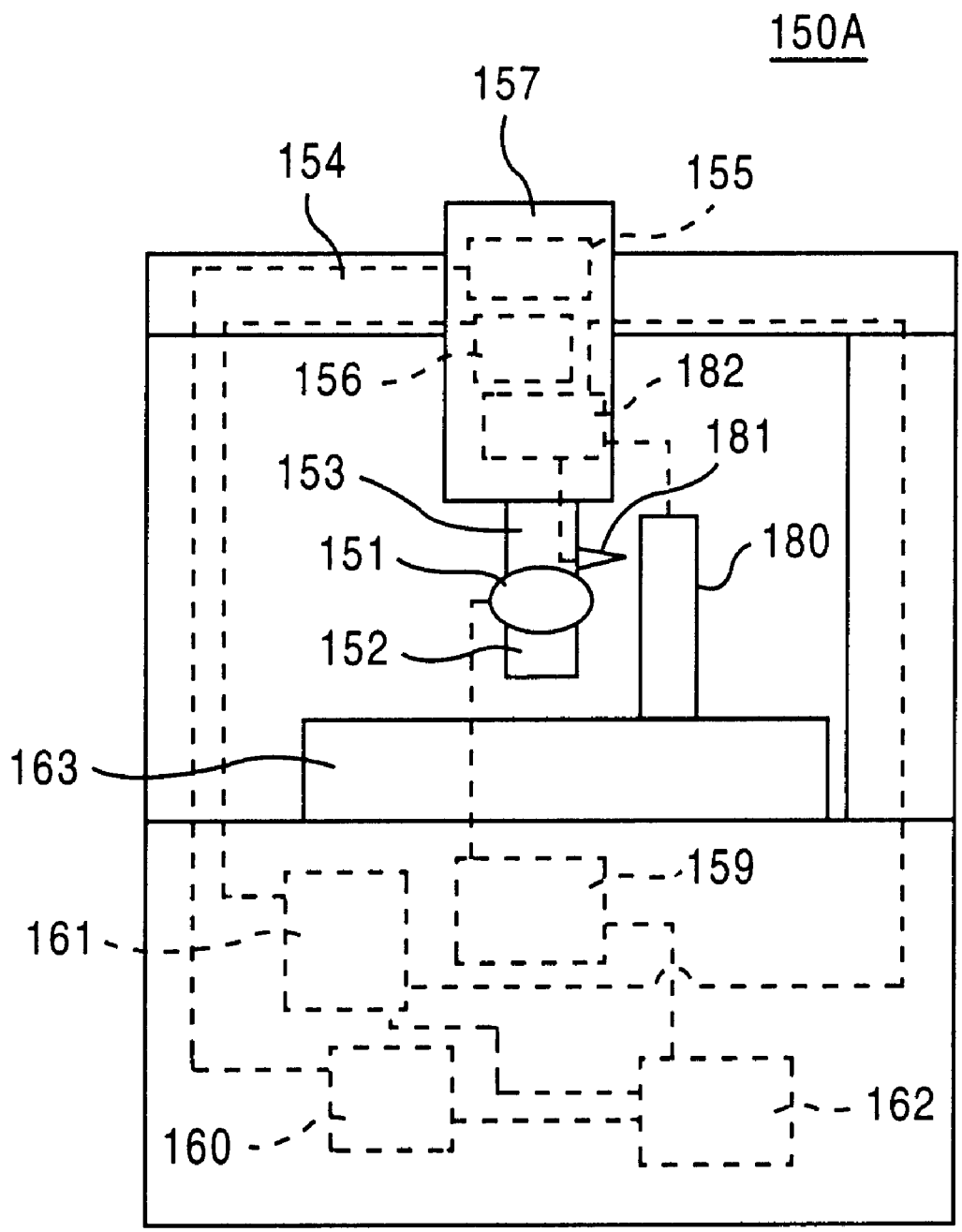
FIG. 11 is a diagram showing a semiconductor chip element mounting device according to a sixth embodiment of the present invention.
Figure 12:
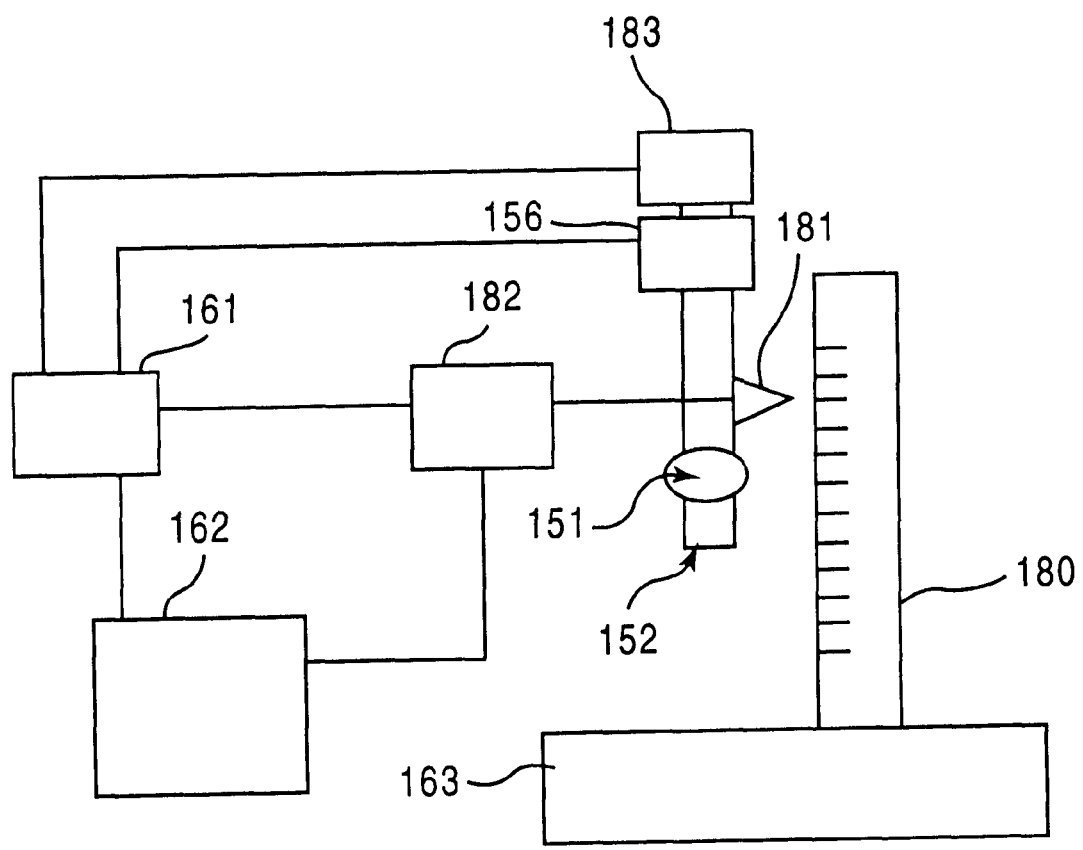
FIG. 12 is a diagram showing a close-up view of just the portion that adjusts the height position of the bonding tool shown in FIG. 10.

FIGS. 11 and 12 show a semiconductor chip element mounting device 150A according to a sixth embodiment of the present invention. In place of the moving-side stopper 165, guide 166 and stationary stopper 167 of the semiconductor chip element mounting device 150 of FIGS. 8A and 8B, the semiconductor chip element mounting device 150A has a magnet scale 180, a height position sensor 181 and a height position detector 182, and mounts the semiconductor chip element 200 having the gold stud bumps shown in FIG. 11 on the circuit board 120.

A side surface of the magnet scale 180 is slightly magnetized and stood atop the stage 163. The height position sensor 181 protrudes laterally from the rod 153 and has a coil (not shown in the diagram), a pointed tip of which is adjacent to the magnet scale and moves vertically up and down together with the bonding tool 152 and detects fluctuations in magnetic flux leaked from a side surface of the magnet scale 180. The height position detector 182 detects the height position of the bonding tool using the information from the height position sensor 181.

The pressure controller 161 is supplied with a signal from the height position detector 182 and, based on the overall controller 162, applies pressure to the pressurizer 183 and the pressure detector 156 before the ultrasonic vibrator 151 is activated. Once the ultrasonic vibrator 151 is activated the pressure controller 161 gradually decreases the pressure so as to maintain the height of the bonding tool 152 at a predetermined height (this is the height position that the height position detector 182 detects). Here, the predetermined height position is the height position at which, as shown in FIG. 12C, the semiconductor chip element 200 is maintained in order to maintain a gap 204A between the chip 201 and the circuit board 120 having a dimension a of approximately 25 μm.

A description will now be given of an operation of the semiconductor chip element 150A, with reference to the accompanying drawings.

FIGS. 13A, 13B, 13C and 13D are diagrams showing a mounting operation of the semiconductor chip element mounting device 150A of FIG. 11. FIGS. 14A, 14B and 14C are time charts of mounting operations.

First, the bonding tool 152 suctionally attaches the semiconductor chip element 200 and aligns the semiconductor chip element 200 with the circuit board 120 as shown in FIG. 13A. Next, the bonding tool 152 descends, the pressure controller 161, the pressurizer 183 and the pressure detector 156 are activated and the semiconductor chip element 200 is pressed onto the circuit board 120 with a pressure P1 (see FIG. 14A) as shown in FIG. 13B. Next, the ultrasonic oscillator 159 is activated, driving the ultrasonic vibrator 151 (see FIG. 14B) and applying both pressure and ultrasonic vibrations to the semiconductor chip element 200 as shown in FIG. 13C. The gold stud bumps 202 elastically deform, in other words flatten, the surfaces of the stud bumps 202 and the electrodes 121 (both made of gold) are rubbed against each other and the stud bumps 201 are ultrasonically bonded to the electrodes 121.

It should be noted that the bonding tool 152 applies both pressure and vibrations to the semiconductor chip element 200, a description of which will now be given with respect to the state shown in FIG. 13C. The ultrasonic vibrations rub the surfaces of the stud bumps 202 and the electrodes 121 together, which causes the stud bump 202 to be worn away slightly. This rubbing away of a small portion of the gold stud bumps 202, if the pressure is applied evenly, causes the gap between the chip 201 and the circuit board 120 to narrow. If at this time the pressure is reduced then the somewhat flattened gold stud bumps 202 elastically return to and reassume their original shape, which limits the narrowing of the gap described above.

When the ultrasonic vibrator 151 is activated, the height position of the bonding tool 152 is adjusted and the pressure controller 161 gradually reduces the pressure applied by the pressurizer 183 along the line b shown in FIG. 14A so that the height position detector 182 continues to detect the above-described predetermined position. Accordingly, the semiconductor chip element 200 is ultrasonically bonded in a state in which a dimension a1 of the gap 204A between the chip 201 and the circuit board 120 is maintained at approximately 25 μm. At a stage in which ultrasonic bonding is completed the pressure applied by the pressurizer 183 is P2 (<P1) as indicated by the line c1 in FIGS. 13C and 14C.

Thereafter, when the bonding tool 152 is removed from the semiconductor chip element 200 and the pressure applied to the semiconductor chip element 200 becomes zero, the gold stud bump 202 further returns elastically to its original shape as indicated by the line c2 in FIG. 14C, maintaining a height dimension a of approximately 30 µm for the gap 204 between the chip 201 and the circuit board 120.

Accordingly, in the event that underfill 122 is injected as a final step so as to fill the entire gap 204, then no unfilled space remains. As a result, the semiconductor chip element 200 is securely mounted on the circuit board 120.

It should be noted that, even if no underfill is injected, the great height of the stud bumps means that thermal stress arising in the space between the semiconductor chip element 200 and the circuit board 120 is absorbed effectively, so the semiconductor chip element 200 is securely mounted on the circuit board 120.

Additionally, the suspension 135 fixedly mounted on the stage 163 as shown in FIG. 4 may be used in place of the above-described circuit board 120. By adjusting the height H of the stationary stopper 167 with respect to the stage 163 to the height H of the suspension 135, the semiconductor chip element 200 is mounted securely on the suspension 135 while maintaining the above-described gap. Specifically, the semiconductor chip element 200 in this case is a head IC that controls the head.

As described above, the invention according to one embodiment comprises a semiconductor chip element including a chip as well as signal stud bumps and non-signal stud bumps dispersedly aligned on a bump formation surface of the chip and the semiconductor chip element being adapted to be bonded and mounted by using ultrasonic vibrations, the semiconductor chip element characterized by having the non-signal stud bumps made of a material having a hardness greater than a hardness of a material from which the signal stud bumps are made.

According to the invention described above, the extent to which the non-signal stud bumps deform during ultrasonic bonding is reduced, and accordingly, a wider gap than is conventionally the case can be maintained on the underside of the mounted chip. As a result, the quality of the underfill injected into the gap can be improved, and moreover, the larger-than-conventional gap described above can be obtained easily, without the use of specialized means.

The invention further comprises the semiconductor chip element characterized in that the signal stud bumps are made of gold (Au) and the non-signal stud bumps are made of a gold-palladium alloy.

According to the invention described above, the non-signal stud bumps can be made harder than the signal stud bumps as appropriate. In a state in which the semiconductor chip element is mounted on the circuit board, the electrical resistance at the bonded portion through which signals pass can be lowered because the signal stud bumps are made of gold.

The invention according to another embodiment comprises a semiconductor chip element including a chip as well as signal stud bumps and non-signal stud bumps dispersedly aligned on a bump formation surface of the chip and the semiconductor chip element being adapted to be bonded and mounted by using ultrasonic vibrations, characterized by having plated bumps on a bump formation surface of the chip and the stud bumps formed on top of the plated bumps.

According to the invention described above, the plated bumps do not deform as easily during ultrasonic bonding, and accordingly, in a mounted state a wider-than-conventional gap can be maintained on the underside of the chip when the semiconductor chip element is mounted on the circuit board. As a result, the degree to which the underfill fills the gap can be improved.

The invention is further characterized in that the stud bumps are made of gold and the plated bumps are made of gold.

According to still other embodiments of the invention, plated bumps may be dispensed with stud bumps, where the plated bumps may be formed of a gold-palladium alloy. Also, combination stacked bumps may be used in which the plated bump portion is made of a gold-palladium alloy and the stud bump portion is made of gold.

According to the invention described above, as a result, the quality of the connection between the stud bump and the plated bump can be improved because the stud bump and the plated bump are both made of the same material.

The invention according to another embodiment comprises a semiconductor chip element mounting structure, in which the semiconductor chip element described above is ultrasonically bonded and mounted to a member to be mounted.

According to the invention described above, as a result, a wider-than-conventional gap can be maintained on the underside of the chip, and accordingly, the underfill injected into the gap can fill the gap more thoroughly. Additionally, in the event that the underfill does not entirely fill the gap, the higher-than conventional bumps mean that the thermal stress arising between the semiconductor chip element and the circuit board can be absorbed more effectively than is conventionally the case, thereby improving the reliability of the mounting of the semiconductor chip element.

The invention according to yet another embodiment comprises a semiconductor chip element mounting device in which a semiconductor chip element comprising a chip and stud bumps dispersedly aligned on a bump formation surface of the chip is pressed by a bonding tool and to which ultrasonic vibrations are applied to bond and mount the semiconductor chip element, the semiconductor chip element mounting device characterized by having restricting means for restricting a height position of the descending bonding tool.

According to the invention described above, by using the limiting means the point of maximum descent of the bonding tool can be set, and accordingly, a wider-than-conventional gap can be obtained on the underside of the chip when the semiconductor chip element is mounted on the circuit board, as a result of which the degree to which the underfill fills the gap can be improved.

The invention according a further embodiment comprises a semiconductor chip element mounting method in which a semiconductor chip element comprising a chip and stud bumps dispersedly aligned on a bump formation surface of the chip is pressed by a bonding tool and to which ultrasonic vibrations are applied to bond and mount the semiconductor chip element, the semiconductor chip element mounting method characterized by having a step of restricting a height position of the descending bonding tool.

According to the invention described above, the point of maximum descent of the bonding tool can be set, and accordingly, a wider-than-conventional gap can be obtained on the underside of the chip when the semiconductor chip element is mounted on the circuit board, as a result of which the degree to which the underfill fills the gap can be improved.

The invention according to yet another embodiment comprises a semiconductor chip element mounting device in which a semiconductor chip element comprising a chip and stud bumps dispersedly aligned on a bump formation surface of the chip is pressed by a bonding tool and to which ultrasonic vibrations are applied to bond and mount the semiconductor chip element, the semiconductor chip element mounting device characterized by having:

bonding tool height position detecting means for detecting a height position of the bonding tool; and adjusting means for adjusting the height position of the bonding tool so as to maintain the height position detected by the bonding tool height position detecting means at a predetermined height.

According to the invention described above, by maintaining the height position of the bonding tool at a predetermined height, a wider-than-conventional gap can be obtained on the underside of the chip when the semiconductor chip element is mounted on the circuit board, as a result of which the degree to which the underfill fills the gap can be improved.

The invention according to a further embodiment comprises a semiconductor chip element mounting method in which a semiconductor chip element comprising a chip and stud bumps dispersedly aligned on a bump formation surface of the chip is pressed by a bonding tool and to which ultrasonic vibrations are applied to bond and mount the semiconductor chip element, the semiconductor chip element mounting method characterized in that a height position of the bonding tool is detected and the height position of the bonding tool is maintained at a predetermined height so as to mount the semiconductor chip element at the predetermined height.

According to the invention described above, by maintaining the height position of the bonding tool at a predetermined height, a wider-than-conventional gap can be obtained on the underside of the chip when the semiconductor chip element is mounted on the circuit board, as a result of which the degree to which the underfill fills the gap can be improved.

What is claimed is:

1. A semiconductor chip element comprising a chip as well as signal stud bumps and non-signal stud bumps dispersedly aligned on a bump formation surface of the chip and the semiconductor chip element being adapted to be bonded and mounted by using ultrasonic vibrations, the semiconductor chip element having the non-signal stud bumps made of a material having a hardness greater than a hardness of a material from which the signal stud bumps are made.

2. The semiconductor chip element of claim 1, wherein the signal stud bumps are made of gold (Au) and the non-signal stud bumps are made of a gold-palladium alloy.

* * * * *